United States Patent
Kainuma et al.

(10) Patent No.: US 7,416,921 B2
(45) Date of Patent: Aug. 26, 2008

(54) METHOD FOR FLIP-CHIP MOUNTING UTILIZING A DELAY CURING-TYPE ADHESIVE WITH TWO-PART HARDENING RESIN

(75) Inventors: Norio Kainuma, Kawasaki (JP); Hidehiko Kira, Kawasaki (JP); Kenji Kobae, Kawasaki (JP); Takayoshi Matsumura, Kawasaki (JP); Kimio Nakamura, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 226 days.

(21) Appl. No.: 11/066,483

(22) Filed: Feb. 28, 2005

(65) Prior Publication Data

US 2006/0099809 A1    May 11, 2006

(30) Foreign Application Priority Data

Nov. 9, 2004    (JP)    ............................. 2004-325277

(51) Int. Cl.
    *H01L 21/00*    (2006.01)
(52) U.S. Cl. ................ 438/118; 438/106; 438/108; 438/114; 257/783; 156/60; 156/327
(58) Field of Classification Search ................ 438/106, 438/108, 114, 118; 257/783; 156/60, 327
    See application file for complete search history.

(56) References Cited

U.S. PATENT DOCUMENTS

| | | | | |
|---|---|---|---|---|
| 3,853,578 A | * | 12/1974 | Suzuki et al. | 427/510 |
| 4,536,524 A | * | 8/1985 | Hart et al. | 523/176 |
| 5,579,573 A | * | 12/1996 | Baker et al. | 29/840 |
| 6,113,728 A | * | 9/2000 | Tsukagoshi et al. | 156/264 |
| 6,326,329 B1 | * | 12/2001 | Nunan | 502/242 |
| 6,383,596 B1 | * | 5/2002 | Arioka et al. | 428/64.1 |
| 6,437,450 B1 | | 8/2002 | Baba et al. | |
| 2002/0164837 A1 | | 11/2002 | Baba et al. | |
| 2004/0047127 A1 | | 3/2004 | Yamauchi et al. | |

FOREIGN PATENT DOCUMENTS

| | | |
|---|---|---|
| JP | 5-235096 | 9/1993 |
| JP | 2001-308145 | 11/2001 |
| JP | 2002-26070 | 1/2002 |
| JP | 2002-203874 | 7/2002 |

\* cited by examiner

*Primary Examiner*—Thanh V Pham
(74) *Attorney, Agent, or Firm*—Arent Fox LLP

(57) ABSTRACT

A method of flip-chip mounting a semiconductor chip can carry out bonding at normal temperature and improves the positional accuracy of bonding. The method of flip-chip bonding a semiconductor chip 52 includes a step of providing a hardening trigger that is not heat to insulating adhesive 51 either before the semiconductor chip 52 is mounted on the substrate 50 or during bonding; and a step of bonding the bumps of the semiconductor chip to the pads of the substrate 50 by pressure welding or metal combining while hardening of the insulating adhesive 51 is progressing due to provision of the hardening trigger.

4 Claims, 3 Drawing Sheets

METHOD FOR FLIP-CHIP MOUNTING UTILIZING A DELAY CURING-TYPE ADHESIVE WITH TWO-PART HARDENING RESIN

BACKGROUND OF THE INVENTION

1. Field of the Invention

The present invention relates to a method of flip-chip mounting a semiconductor chip that bonds a semiconductor chip to a substrate at low temperature and a mounting apparatus that uses the same method.

2. Related Art

Among typical methods of flip-chip mounting a semiconductor chip to a substrate, there is a method that bonds a semiconductor chip onto a substrate by applying a thermosetting resin to the substrate, positioning and disposing the semiconductor chip on the substrate from above the thermosetting resin, and applying pressure to the semiconductor chip using a bonding tool while applying heat to thermoset the thermosetting resin. There is also a method that bonds the semiconductor chip to the substrate more strongly by having the bonding tool also apply ultrasonic vibration to the semiconductor chip to combine metal parts using ultrasound.

When ultrasonic bonding is carried out, there is also a method that fills, after the semiconductor chip has been bonded using ultrasound, a space between the semiconductor chip and the substrate with thermosetting resin (post-filling with underfill resin) and then applies heat to set the thermosetting resin. When this method is used, during the bonding of the semiconductor chip to the substrate using ultrasound, ultrasonic bonding is carried out while the ambient temperature is heated to a substantially equal temperature to the heating temperature (around 150° C.) of the thermosetting resin. In this way, heating is also carried out during bonding using ultrasound firstly to increase the bonding force, and also to make the thermal contraction that occurs between the members during ultrasonic bonding and the thermal contraction that occurs due to the thermal effect of the thermosetting resin as equal as possible and thereby prevent detachment of the bonded parts.

Each of the conventional methods of bonding a semiconductor chip described above requires a heating step, so that there is the problem that large-scale equipment is needed. Also, since the coefficients of thermal expansion of the semiconductor chip and the substrate are different, there is a further problem that positional displacement can easily occur between both parts, thereby reducing the positional accuracy of the bonding of the semiconductor chip.

Japanese Laid-Open Patent Publication No. 2001-308145 discloses a method of mounting that places a semiconductor chip with bumps on a substrate with pads onto which an underfill adhesive has been applied and applies heat and ultrasonic vibration using a bonding tool to bond the bumps and pads, wherein during the application of heat and ultrasound, UV rays are irradiated to harden a surrounding part of the adhesive that has been pressed outward between the semiconductor chip and the substrate.

However, in the above method of mounting, although the surrounding part of the adhesive is hardened by irradiation with UV rays, the UV rays do not reach the adhesive between the semiconductor chip and the substrate which remains unhardened, resulting in the problem that a step that completely hardens the adhesive by applying heat has to be carried out at an appropriate time afterwards.

Patent Document 1
Japanese Laid-Open Patent Publication No. 2001-308145

As described above, there have been the problems of a heating device being required in each of the conventional methods of mounting, resulting in an increase in the scale of the equipment, and of reduced positional accuracy for the mounting.

SUMMARY OF THE INVENTION

The present invention was conceived to solve the above problems and it is an object of the present invention to provide a method of flip-chip mounting a semiconductor chip and a mounting apparatus using the same method that can carry out bonding at normal temperature, that do not require a large-scale heating device, that can carry out bonding even for semiconductor chips with low heat resistance, and that can improve the positional accuracy of mounting.

A method of flip-chip mounting a semiconductor chip according to the present invention places bumps of the semiconductor chip and pads of a substrate in contact, flip-chip bonds the semiconductor chip to the substrate, and fills a space between the semiconductor chip and the substrate with insulating adhesive, the method including: a step of providing a hardening trigger that is not heat to the insulating adhesive before the semiconductor chip is mounted on the substrate or during bonding; and a step of bonding the bumps of the semiconductor chip to the pads of the substrate by pressure welding or metal combining while hardening of the insulating adhesive is progressing due to the hardening trigger having been provided.

A delayed curing-type adhesive, which has irradiation with UV rays as the hardening trigger, may be used as the insulating adhesive, and the method may further include: a step of applying the delayed curing-type adhesive onto a mounting position on the substrate; a step of irradiating the applied delayed curing-type adhesive with UV rays; and a step of positioning and disposing the semiconductor chip on the delayed curing-type adhesive that has been irradiated with the UV rays and bonding the bumps of the semiconductor chip to the pads of the substrate.

Alternatively, a two-part hardening resin may be used as the insulating adhesive and the method may further include: a step of applying one liquid out of the two-part hardening resin onto a mounting position on the substrate and then mixing another liquid out of the two-part hardening resin with the one liquid; and a step of positioning and disposing the semiconductor chip on the substrate on which the two-part hardening resin has been applied and bonding the bumps of the semiconductor chip to the pads of the substrate.

As another alternative, a two-part hardening resin may be used as the insulating adhesive and the method may further include: a step of applying one liquid out of the two-part hardening resin onto a mounting position on the substrate and applying another liquid out of the two-part hardening resin onto a bonding surface of the semiconductor chip; and a step of positioning and disposing the semiconductor chip on the substrate onto which the one liquid out of the two-part hardening resin has been applied and bonding the bumps of the semiconductor chip to the pads of the substrate.

As yet another alternative, a two-part hardening resin, where one liquid out of the two-part hardening resin is sealed in microcapsules that are mixed in another liquid out of the two-part hardening resin, may be used as the insulating adhesive, the two-part hardening resin may be applied onto a mounting position on the substrate, and the semiconductor chip may be positioned and disposed on the substrate onto which the two-part hardening resin has been applied and the microcapsules may be ruptured by energy during bonding to harden the two-part hardening resin.

A flip-chip mounting apparatus for a semiconductor chip according to the present invention flip-chip bonds the semiconductor chip to a substrate and fills a space between the semiconductor chip and the substrate with insulating adhesive, the apparatus including: a stage onto which the substrate is conveyed; a bonding tool that is disposed above the stage, holds the semiconductor chip on a lower surface thereof, and can move relatively to the stage so as to approach and move away from the stage; an applying unit that applies a delayed curing-type insulating adhesive, for which irradiation with UV rays is a hardening trigger, onto the substrate; a conveying unit that conveys the substrate, onto which the insulating adhesive has been applied, from the applying unit onto the stage; and a UV irradiating unit that irradiates the insulating adhesive applied onto the substrate with UV rays.

The flip-chip mounting apparatus may further include a camera device for position recognition that can be inserted between the stage and the bonding tool and detects positions of the substrate conveyed onto the stage and the semiconductor chip held on the bonding tool, wherein a light source that emits light including UV rays may be used as a position recognition camera light source of the camera device, the camera device may double as the UV irradiating unit, and during a position recognition operation for the position of the substrate, UV rays that are the hardening trigger may be irradiated onto the insulating adhesive applied onto the substrate.

Another flip-chip mounting apparatus for a semiconductor chip according to the present invention flip-chip bonds the semiconductor chip onto a substrate and fills a space between the semiconductor chip and the substrate with insulating adhesive, the apparatus including: a stage onto which the substrate is conveyed; a bonding tool that is disposed above the stage, holds the semiconductor chip on a lower surface thereof, and can move relatively to the stage so as to approach and move away from the stage; a first applying unit that applies one liquid out of the insulating adhesive, which is composed of a two-part hardening resin, onto a mounting position on the substrate; a second applying unit that applies another liquid out of the insulating adhesive onto a bonding surface of the semiconductor chip; a first conveying unit that conveys the substrate onto which the one liquid out of the insulating adhesive has been applied from the first applying unit onto the stage; and a second conveying unit that has the semiconductor chip, onto which the other liquid out of the insulating adhesive has been applied from the second applying unit, held by the bonding tool.

The present invention is effective in that a large-scale heating device is not required, bonding can be carried out even for semiconductor chips with low heat resistance, and the positional accuracy of mounting is improved.

BRIEF DESCRIPTION OF THE DRAWINGS

The aforementioned and other objects and advantages of the present invention will become apparent to those skilled in the art upon reading and understanding the following detailed description with reference to the accompanying drawings.

In the drawings.

DESCRIPTION OF THE PREFERRED EMBODIMENTS

Preferred embodiments of the present invention will now be described in detail with reference to the attached drawings.

As described above, a method of flip-chip mounting a semiconductor chip according to the present invention places bumps of a semiconductor chip and pads of a substrate in contact, flip-chip bonds the semiconductor chip to the substrate, and fills a space between the semiconductor chip and the substrate with insulating adhesive, the method including a step of providing a hardening trigger that is not heat to the insulating adhesive before the semiconductor chip is mounted on the substrate or during bonding and a step of bonding the bumps of the semiconductor chip and the pads of the substrate by pressure welding or metal combining while hardening of the insulating adhesive is progressing due to the hardening trigger having been provided.

Figure 1:
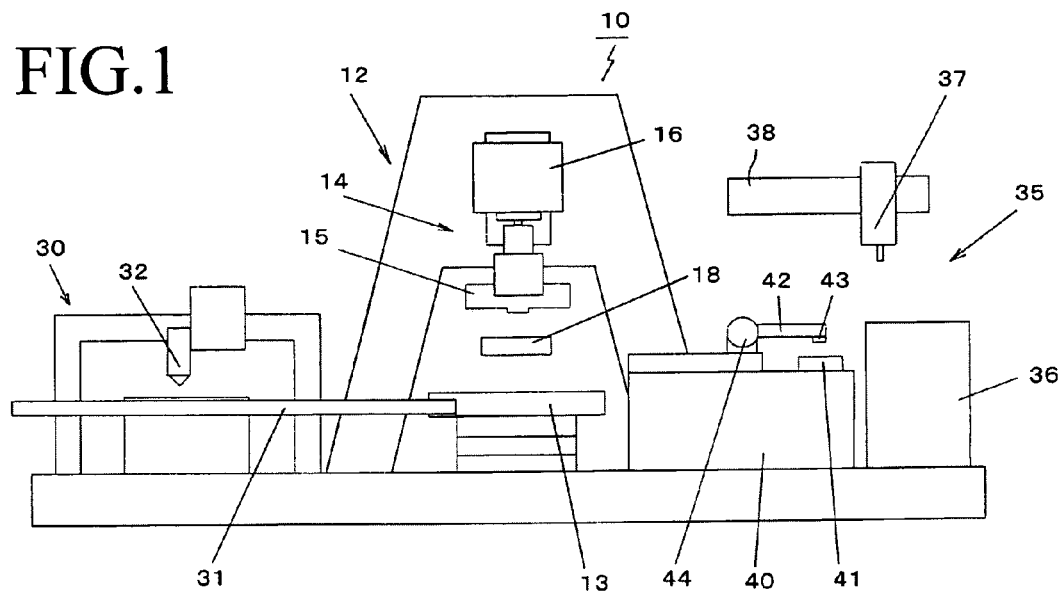
FIG. 1 is a schematic diagram showing an entire flip-chip mounting apparatus according to the present invention.

FIG. 1 is a schematic diagram showing the entire construction of one example of a flip-chip mounting apparatus 10.

Reference numeral 12 designates an ultrasonic bonding unit. The ultrasonic bonding unit 12 includes a stage 13 onto which a substrate is conveyed and a bonding tool 14 that is disposed above the stage 13, holds a semiconductor chip on a lower surface thereof, and can move relatively toward and away from the stage 13.

The stage 13 is composed of a well-known XY table and can be moved in a desired direction within a horizontal plane by a driving unit, not shown. The XY table is constructed so as to be capable of being rotated within the horizontal plane about the vertical axis by a rotational driving unit, not shown.

The bonding tool 14 is composed of a well-known ultrasonic bonding device, and includes a horn 15 for ultrasonic bonding and a pressing device 16 that is composed of a cylinder mechanism or the like that moves the horn 15 up and down. A semiconductor chip is held on a lower surface of the horn 15 by suction.

A camera device 18 for position recognition is disposed so as to be capable of being inserted between the stage 13 and the bonding tool 14. The camera device 18 detects the positions of a substrate conveyed onto the stage 13 and a semiconductor chip held on the horn 15 of the bonding tool 14, and aligns the substrate and the semiconductor chip by horizontally moving the stage 13 and/or rotating the stage 13 within the horizontal plane.

The camera device 18 includes a camera light source, not shown. This camera light source irradiates light onto the substrate that has been conveyed onto the stage 13 and the semiconductor chip held on the horn 15 to facilitate position recognition by a camera. This camera light source can irradiate light including visible light and UV rays.

Figure 2:
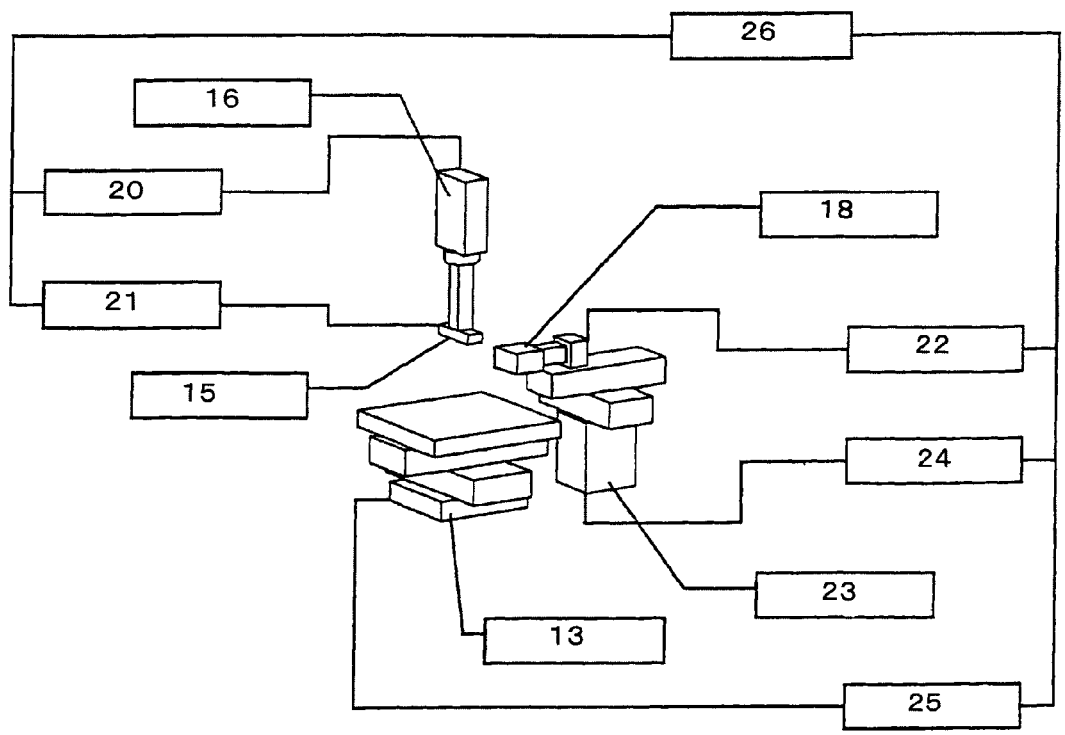
FIG. 2 is a diagram useful in further explaining an ultrasonic bonding unit in the mounting apparatus shown in FIG. 1.

FIG. 2 is a diagram useful in further explaining the ultrasonic bonding unit 12. The ultrasonic bonding unit 12 is a well-known mechanism and therefore will be described in brief.

Reference numeral 20 designates a pressing force control unit that controls the pressing device 16, 21 an ultrasonic vibrator, 22 an image processing unit, 23 a moving device that moves the camera device 18, 24 a movement control unit that controls movement by the moving device 23, 25 an alignment control unit that controls movement and rotation of the stage 13, and 26 a main controller.

By driving the moving device 23 using the movement control unit 24, the camera device 18 is inserted between the substrate that has been conveyed onto the stage 13 and the semiconductor chip that is held on the horn 15 by suction.

Image data from the camera device 18 is inputted into the image processing unit 22, positional displacements between the substrate and the semiconductor chip are detected, and the stage 13 is moved and/or rotated by the alignment control unit 25 to correct any positional displacements, thereby aligning the substrate and the semiconductor chip. Next, the camera device 18 is withdrawn. After this, the pressing device 16 is driven by the pressing force control unit 20 to lower the horn 15 and apply a predetermined force to the semiconductor chip held on the lower surface of the horn 15 and ultrasound is applied from the ultrasonic vibrator 21 to the semiconductor chip to bond the semiconductor chip to the substrate. Driving control of the various control units is entirely carried out by a processing program set in the main controller 26.

Next, returning to FIG. 1, the mounting apparatus 10 will be described further.

Reference numeral 30 designates an applying unit. The applying unit 30 applies a delayed curing-type insulating adhesive that has irradiation with UV rays as a hardening trigger. The substrate is conveyed into the applying unit 30 by a substrate conveyor (conveying unit) 31, the insulating adhesive is applied inside the applying unit 30, and the substrate onto which the insulating adhesive has been applied is conveyed by the substrate conveyor 31 onto the stage 13.

The applying unit 30 can be constructed of a spin coating mechanism and the like that includes a dispenser 32 and a rotation table (not shown). However, it should be obvious that the applying unit 30 is not limited to a spin coating mechanism.

In the present embodiment, a delayed curing-type adhesive for which irradiation with UV rays is the hardening trigger is used as the insulating adhesive. As this delayed curing-type adhesive, a material that has epoxy resin as the base resin and for which a curing reaction occurs due to cationic polymerization is used.

In FIG. 1, reference numeral 35 designates a conveying unit for semiconductor chips.

A large number of semiconductor chips are stored on a tray (not shown) and are supplied by a chip supplying stage 36. Using a chip handler 38 that includes a suction nozzle 37 that can move up and down and horizontally, the semiconductor chips stored in the tray are held one at a time by suction on the suction nozzle 37 and are conveyed onto a mounting table 41 of a chip inverting stage 40.

The chip inverting stage 40 has a suction arm 42. The suction arm 42 includes a suction nozzle 43 and is provided so as to be capable of being inverted by 180° by an inverting device 44 between a position located above the mounting table 41 and a position on an opposite side. The inverting device 44 is also provided so as to be capable of being moved back and forth by a driving unit, not shown, in a direction that approaches the mounting table 41 and a direction that approaches the horn 15.

The semiconductor chip is conveyed onto the mounting table 41 with a surface on which bumps are formed facing upwards. By holding the semiconductor chip conveyed onto the mounting table 41 by suction on the suction nozzle 43 of the suction arm 42, inverting the suction arm 42, and moving the semiconductor chip towards the horn 15, the semiconductor can be held on the lower surface of the horn 15 by suction. The semiconductor chip therefore becomes held by suction on the horn 15 with the surface on which the bumps are formed facing downwards.

It should be noted that the suction nozzle 43 is provided so as to be capable of being inwardly and outwardly projected (moved) by a mechanism, not shown, in a direction perpendicular to the suction arm 42 so that a semiconductor chip can be smoothly transferred between the mounting table 41 and the horn 15.

FIGS. 3A to 3E are schematic diagrams of processes that carry out flip-chip mounting of a semiconductor chip using the mounting apparatus 10 described above.

Figure 3A:
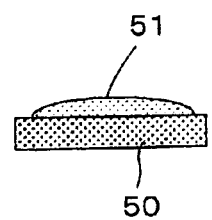
FIGS. 3A to 3E are diagrams useful in showing one example of a mounting step.

As shown in FIG. 3A, in the applying unit 30, a delayed curing-type adhesive 51 is applied onto a substrate 50.

The substrate 50 onto which the delayed curing-type adhesive 51 has been applied is conveyed onto the stage 13 from the applying unit 30 by the substrate conveyor 31.

On the other hand, as described above, a semiconductor chip 52 is conveyed into the ultrasonic bonding unit 12 by a conveying unit 35 for semiconductor chips and is held by suction on the lower surface of the horn 15.

The camera device 18 is inserted between the substrate 50 conveyed onto the stage 13 and the semiconductor chip 52 held on the horn 15 and alignment of the substrate 50 and the semiconductor chip 52 is carried out as described above.

Figure 3B:
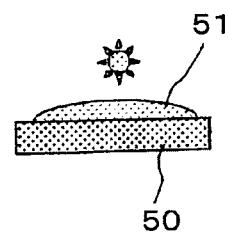
Figure 3C:
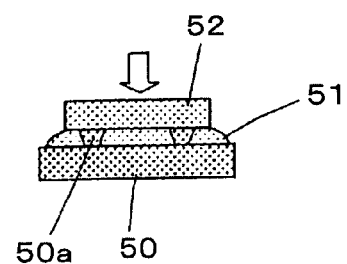

When alignment is carried out by the camera device 18, light including UV rays is irradiated from the camera light source onto the substrate 50 onto which the delayed curing-type adhesive 51 has been applied. This state is shown in FIG. 3B. When alignment of the substrate 50 and the semiconductor chip 52 is carried out, the delayed curing-type adhesive 51 is simultaneously irradiated with UV rays, so that a corresponding reduction is made in the processing time. Irradiation with UV rays is a hardening trigger, but since the adhesive 51 is a delayed curing-type, the adhesive 51 does not harden immediately and the substrate 50 and the semiconductor chip 52 can be sufficiently aligned in the intervening period.

Next, the camera device 18 is withdrawn and the horn 15 on which the semiconductor chip 52 is held by suction is lowered by the pressing device 16 so that the semiconductor chip 52 is pressed onto the substrate 50 with the required pressing force. After this, the ultrasonic vibrator 21 is operated and ultrasound is applied to the semiconductor chip 52 from the horn 15. By doing so, bumps 50a of the semiconductor chip 52 are ultrasonically bonded to pads (not shown) of the substrate 50.

When the semiconductor chip 52 is ultrasonically bonded, the ambient temperature is kept at normal temperature.

The delayed curing-type adhesive 51 gradually hardens.

Figure 3D:
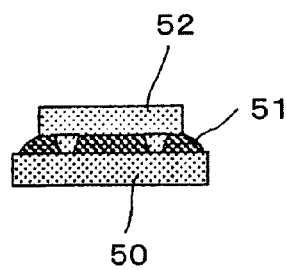

By doing so, the bonding of the semiconductor chip 52 and the hardening of the delayed curing-type adhesive 51 can be carried out at low temperature (normal temperature). This state is shown in FIG. 3D.

In this way, there is no heating process when the semiconductor chip 52 is bonded, so that even if the semiconductor chip 52 and the substrate 50 have different coefficients of thermal expansion, there will be no thermal expansion or contraction and therefore problems such as detachment of the bonded parts do not occur. The positional accuracy of the bonding of the semiconductor chip is also improved. Since a heating device is not required, the equipment can be simplified. It also becomes possible to bond a semiconductor chip 52 that has low heat resistance.

Figure 3E:
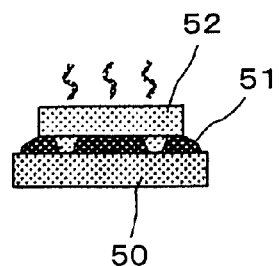

After the delayed curing-type adhesive 51 has hardened, as shown in FIG. 3E, heat is applied as necessary to cure the delayed curing-type adhesive 51. This curing is carried out afterwards in a state where the hardening of the delayed curing-type adhesive is substantially complete, so that there is no risk of the bonded parts becoming detached.

It should be noted that although bonding is carried out by applying ultrasonic vibration to the semiconductor chip 52 in the embodiment described above, metal combining (which includes metal surface active bonding) of the bumps 50a of the semiconductor chip 52 and the pads of the substrate 50 may be carried out by a means aside from ultrasound.

Alternatively, the semiconductor chip 52 may be bonded by a pressure welding method that simply presses the semiconductor chip 52 onto the substrate 50, onto which the delayed curing-type adhesive 51 has been applied, using the pressing device 16. In this case, the semiconductor chip 52 is attached by hardening the delayed curing-type adhesive so that the bonding of the semiconductor chip 52 on the substrate 50 can be maintained.

Although the camera device 18 is also used as a UV irradiating device and irradiates the insulating adhesive 51 applied onto the substrate 50 with UV rays as the hardening trigger during the recognition operation of the position of the substrate 50 in the embodiment described above, it should be obvious that it is also possible to provide a UV irradiating device separately to the camera device 18.

Figure 4:
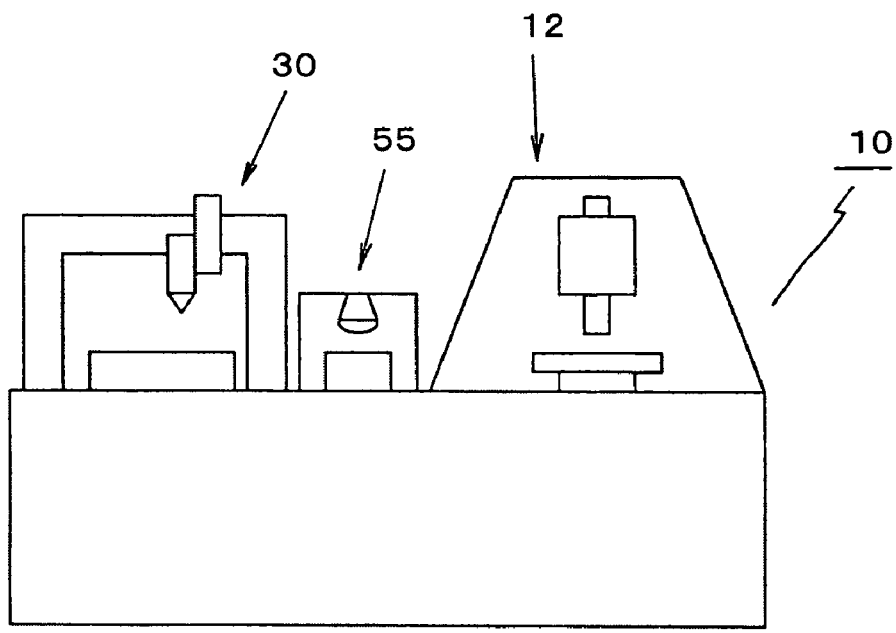
FIG. 4 is a diagram useful in explaining a mounting apparatus for the case where a UV irradiating device is provided separately.

In this case, as shown in FIG. 4, it is possible to dispose a UV irradiating device 55 between the applying unit 30 and the ultrasonic bonding unit 12, to apply the delayed curing-type adhesive 51 using the applying unit 30, and to irradiate the substrate 50 conveyed by the substrate conveyor 31 with UV rays.

Also, although a UV-curing-type insulating adhesive 51 is used in the embodiment described above, it is possible to use a two-part hardening resin as the insulating adhesive. In this case, a delayed curing-type adhesive should preferably be used as the two-part hardening resin.

When a two-part hardening resin is used, a dispenser that applies one liquid out of the two-part hardening resin and a dispenser that applies the other liquid out of the two-part hardening resin are disposed in the applying unit 30 (neither dispenser is shown).

In the applying unit 30, one liquid in the two-part hardening resin is applied onto a mounting position on the substrate 50 by one dispenser, the other liquid in the two-part hardening resin is then applied by the other dispenser, and the two liquids are mixed. This mixing of the two liquids is the hardening trigger. The mixing of the two liquids may be carried out immediately before the substrate 50 is conveyed into the ultrasonic bonding unit 12.

The substrate 50 onto which the two-part hardening resin has been applied in this way is conveyed onto the stage 13 of the ultrasonic bonding unit 12 and the semiconductor chip 52 is bonded onto the substrate 50 in the same way as described above.

In this case also, aside from ultrasonic bonding, the bonding of the semiconductor chip 52 can be carried out by a method of metal combining and/or pressure welding. In any of such cases, the bonding of the semiconductor chip 52 can be carried out at normal temperature.

In the above embodiment that uses a two-part hardening resin, both liquids in the two-part hardening resin are applied onto the substrate 50 by the applying unit 30 with some time in between, but it is also possible to apply one liquid in the two-part hardening resin onto the mounting position on the substrate 50 and the other liquid onto a bonding surface of the semiconductor chip 52. In this case, it is necessary to provide an applying unit (not shown) that applies the other liquid onto the bonding surface of the semiconductor chip 52 separately to the applying unit 30. As one example, an applying device, which applies the other liquid onto the surface on which the bumps are formed on the semiconductor chip 52 that is held by suction on the lower surface of the horn 15, may be provided so as to be free to advance and retreat along the semiconductor chip 52. An applying jig such as a sponge soaked with the other liquid is attached in advance to this applying device. In this embodiment, when the semiconductor chip 52 is placed in contact with the substrate 50, the two liquids are mixed, thereby producing the hardening trigger, so that the hardening trigger is provided when the semiconductor chip is bonded.

Alternatively, when a two-part hardening resin is used, a two-part hardening resin where one liquid is sealed in microcapsules mixed inside the other liquid is used, the two-part hardening resin is applied onto the substrate 50 by the applying unit 30, the substrate 50 onto which the two-part hardening resin has been applied is conveyed into the ultrasonic bonding unit 12, and the semiconductor chip 52 is bonded in the same way as described above by applying ultrasound to the semiconductor chip 52. In this case, the microcapsules are ruptured by the energy during ultrasonic bonding and/or by the load during pressure welding, so that the two liquids are mixed and the two-part hardening resin is hardened. In this embodiment also, the hardening trigger is provided when the semiconductor chip is bonded.

What is claimed is:

1. A method of flip-chip mounting a semiconductor chip that places bumps of the semiconductor chip and pads of a substrate in contact, flip-chip bonds the semiconductor chip to the substrate, and fills a space between the semiconductor chip and the substrate with an insulating adhesive, comprising:
    a step of providing a hardening trigger that is not heat to the insulating adhesive before the semiconductor chip is mounted on the substrate or during bonding; and
    a step of bonding the bumps of the semiconductor chip to the pads of the substrate by pressure welding or metal combining while hardening of the insulating adhesive is progressing due to the hardening trigger having been provided,
    wherein a two-part hardening resin is used as the insulating adhesive and the method further comprises:
    a step of applying one liquid out of the two-part hardening resin onto a mounting position on the substrate and then mixing another liquid out of the two-part hardening resin with the one liquid; and
    a step of positioning and disposing the semiconductor chip on the substrate onto which the two-part hardening resin has been applied and bonding the bumps of the semiconductor chip to the pads of the substrate.

2. A method of flip-chip mounting a semiconductor chip that places bumps of the semiconductor chip and pads of a substrate in contact, flip-chip bonds the semiconductor chip to the substrate, and fills a space between the semiconductor chip and the substrate with an insulating adhesive, comprising:
    a step of providing a hardening trigger that is not heat to the insulating adhesive before the semiconductor chip is mounted on the substrate or during bonding; and
    a step of bonding the bumps of the semiconductor chip to the pads of the substrate by pressure welding or metal combining while hardening of the insulating adhesive is progressing due to the hardening trigger having been provided,
    wherein a two-part hardening resin is used as the insulating adhesive and the method further comprises:
    a step of applying one liquid out of the two-part hardening resin onto a mounting position on the substrate and applying another liquid out of the two-part hardening resin onto a bonding surface of the semiconductor chip; and
    a step of positioning and disposing the semiconductor chip on the substrate onto which the one liquid out of the two-part hardening resin has been applied and bonding the bumps of the semiconductor chip to the pads of the substrate.

3. A method of flip-chip mounting a semiconductor chip according to claim 1, wherein the insulating adhesive is hardened at normal temperature.

4. A method of flip-chip mounting a semiconductor chip according to claim 2, wherein the insulating adhesive is hardened at normal temperature.

\* \* \* \* \*